United States Patent [19]
Kennedy

[11] 4,177,083
[45] Dec. 4, 1979

[54] PHOTOVOLTAIC CONCENTRATOR
[75] Inventor: William S. Kennedy, San Jose, Calif.
[73] Assignee: Acurex Corporation, Mountain View, Calif.
[21] Appl. No.: 830,780
[22] Filed: Sep. 6, 1977
[51] Int. Cl.² ............................................. H01L 31/04
[52] U.S. Cl. ................................ 136/89 CA; 250/239
[58] Field of Search ........... 136/89 PC, 89 H, 89 CA; 250/239; 126/270, 271

[56] References Cited
U.S. PATENT DOCUMENTS

| | | | |
|---|---|---|---|
| 3,988,166 | 10/1976 | Beam | 136/89 |
| 4,052,228 | 10/1977 | Russell | 136/89 PC |
| 4,078,944 | 3/1978 | Mlavsky | 136/89 H |
| 4,084,576 | 4/1978 | Pei | 126/270 |
| 4,131,485 | 12/1978 | Meinez et al. | 136/89 PC |

*Primary Examiner*—Aaron Weisstuch
*Attorney, Agent, or Firm*—Flehr, Hohbach, Test, Albritton & Herbert

[57] ABSTRACT

A photovoltaic concentrator utilizes as an airtight enclosure a fused glass structure similar to an automotive sealed-beam headlamp. One of the halves is aluminized to provide a reflector for the impinging sunlight and for focusing it on a photocell carried within the enclosure. The foregoing structure because of developed mass production techniques is low cost and in addition the airtight rugged enclosure protects the fragile reflective surface and photocell.

1 Claim, 5 Drawing Figures

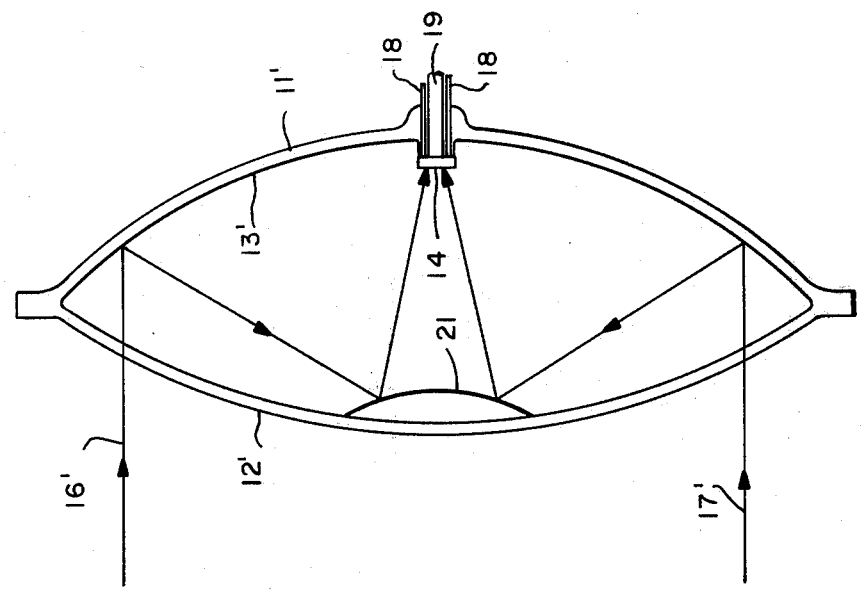
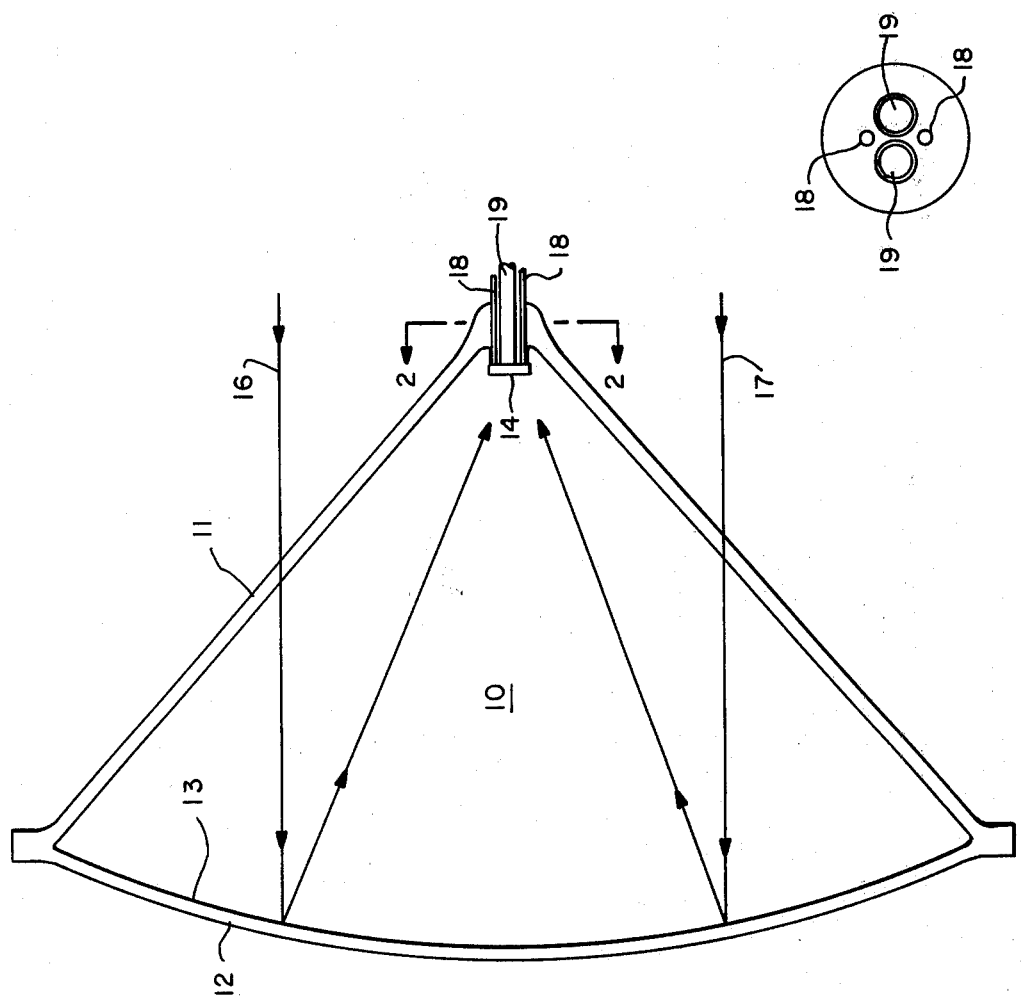

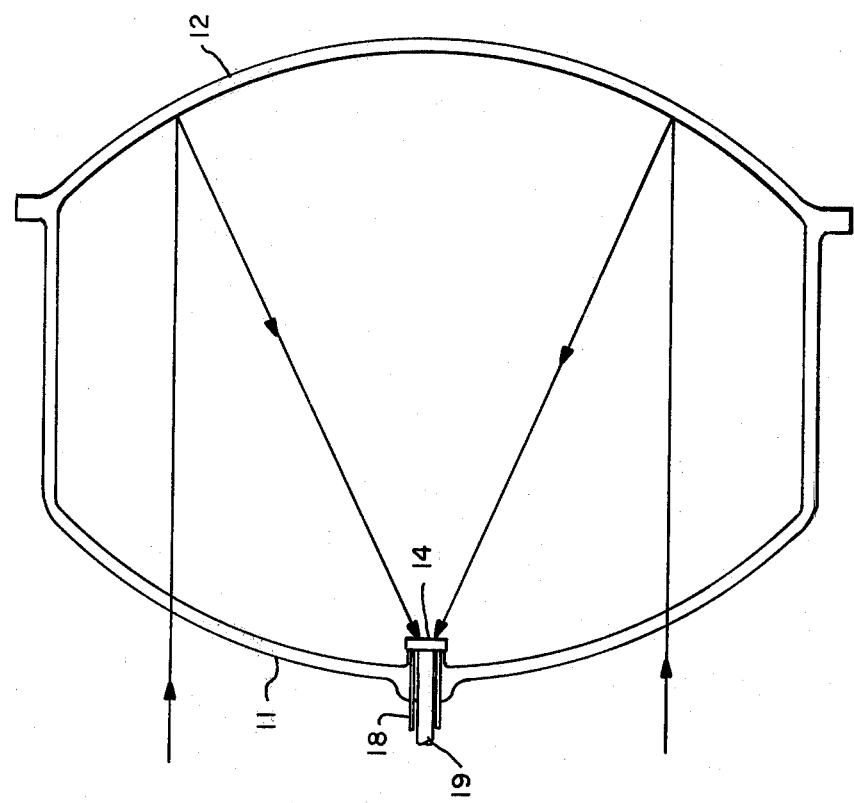
FIG.—5
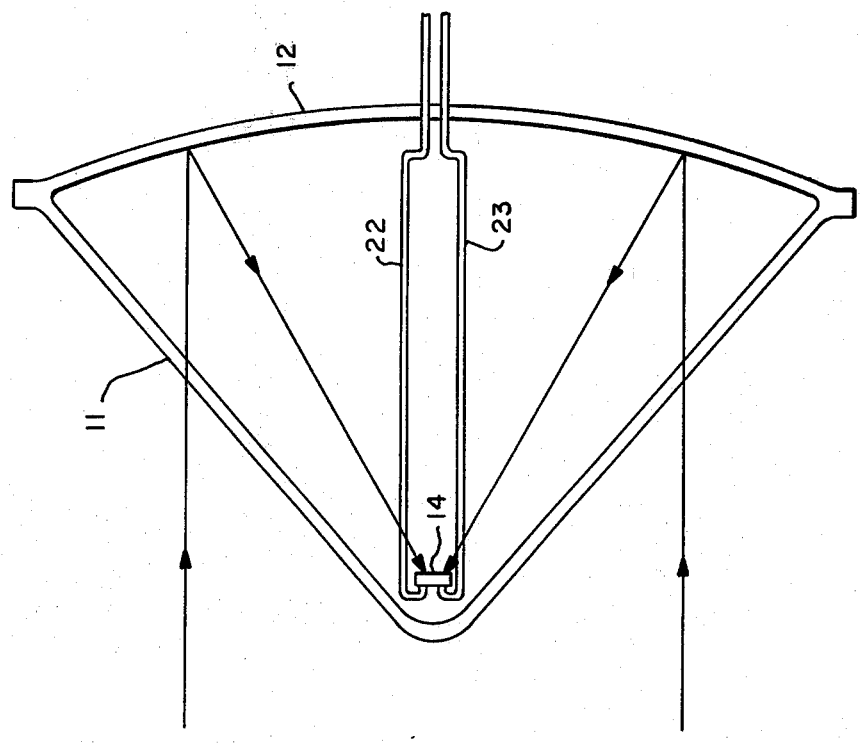
FIG.—4

PHOTOVOLTAIC CONCENTRATOR

BACKGROUND OF THE INVENTION

The present invention is directed to a photovoltaic concentrator and more specifically to a concentrator suitable for use as a module in a large scale solar energy system.

Photovoltaic concentrators in general are well-known and consist generally of two different types. The first uses a Fresnel lens which concentrates sunlight on a photocell. The second type utilizes the classic Newtonian reflecting telescope configuration where a reflecting mirror focuses sunlight on the photocell.

A major problem with both of the above configurations is the lack of protection for the delicate surfaces of the system; these include the reflective surface and the photocell itself. In the case of the photocell, protection has been attempted by encasing the entire cell in a glass cover. The reflector especially in a desert atmosphere is, of course, subject to blowing sand and rocks, rain sleet and hail, etc. Another difficulty with the foregoing is cost. Since large scale arrays of the concentrators are necessary to generate any substantial amount of power they must be amenable to mass production techniques.

OBJECTS AND SUMMARY OF THE INVENTION

It is, therefore, a general object of the present invention to provide an improved photovoltaic concentrator.

It is a more specific object to provide a concentrator as above which protects the delicate surfaces of the concentrator and at the same time utilizes low cost mass production techniques.

In accordance with the above objects there is provided a photovoltaic concentrator in which a photocell means converts received light to electrical energy. Reflector means receive sunlight and focus such light onto the photocell. An air tight enclosure means retains the reflector and photocell means in a fixed physical relationship and in an inert atmosphere.

From a method standpoint there is provided a method of forming a photovoltaic concentrator. Two transparent glass halves of an enclosure are formed and a photocell is affixed to one of such halves. The other glass half is coated with a reflective material. The edges of the halves are sealed together to form the enclosure which is purged and sealed off.

BRIEF DESCRIPTION OF THE DRAWINGS

FIG. 1 is a cross-sectional view of one embodiment of the invention;

FIG. 2 is an enlarged cross-sectional view taken along the lines 2—2 of FIG. 1; and FIGS. 3, 4 and 5 are cross-sectional views of other embodiments of the invention.

DETAILED DESCRIPTION OF THE PREFERRED EMBODIMENTS

In the embodiment of FIG. 1 an airtight enclosure 10 is formed by fusion sealing of a transparent glass cone half 11 with a glass reflector half 12 which carries on its interior surface a deposited aluminum layer 13 which serves as a reflector. At the apex of cone 11 is mounted a gallium arsenide (GaAs) photocell 14 upon which the sunlight is focused. Specifically, the typical rays 16 and 17 are transmitted through the clear glass cone 11, reflected at surface 13 and focused by the parabolic shape of the surface at the photocell 14. Photocell 14 is thus a receiver for the impinging light. It also includes, as further illustrated in FIG. 2, provision for a pair of electrical conductors 18 and a pair of coolant tubes 19 which are required in order that the photocell's temperature does not increase above a predetermined level.

In order to prevent any extreme hotspots in photocell 14 it is preferred that the shape of the reflector 13 be slightly altered so as to avoid a point focus but rather produce a blur.

As is apparent, the enclosure 10 is very similar to the sealed-beam headlamp used for automobiles. In fact, it is the exact intention of the invention to utilize the sealed-beam headlamp technology which is inherently low cost because of the mass high volume production technology which has been developed. This airtight enclosure fully protects the delicate surfaces of the photocell 14 and the aluminized reflector 13.

The purpose of an automotive sealed-beam headlamp is to protect a relatively fragile filament from mechanical damage and chemical attack and also protect its reflector surface from chemical degradation, and to accomplish the above in a harsh environment of driving rain, sand, and stones. The same objectives also serve the purposes of the present invention where similar ambient conditions may be encountered.

The production of the photovoltaic concentrator of the present invention is achieved in almost the same manner as an automobile headlamp. Specifically, hot boro-silicate glass ingots are individually pressed between steel molds to form the desired halves, 11 and 12, of the enclosure 10. The exact shape depends on the optical quality and focusing etc. desired.

The reflective half 12 of the enclosure is coated internally with aluminum by putting two reflector halves face to face and then evacuating the cavity between them so that vaporized aluminum is deposited against the inside surface of both reflectors simultaneously.

At the same time or later the photocell components 14 are fused into the apex of the enclosure half 11. Other miscellaneous components may be added at this time also.

The two halves then have their extremities joined or fused together by a special flame. This technique has been well-developed in the automobile headlamp technology since the flame must have a temperature and be accurately positioned so that the glass reaches fusion temperature at the joint before the surrounding areas become overheated. In addition, the glass must melt where fusion is to occur but must remain firm a fraction of an inch from the fusion point to preserve the optical accuracy of the surface. Finally, in fusing, the entire assembly is rotated axially through a series of small stationary oxyhydrogen torches. This is done very rapidly to prevent the glass in the surrounding areas from softening and to prevent the aluminized surface from oxidizing near the rim.

The assembled enclosure is then evacuated and flushed with nitrogen. After the final evacuation the enclosure is filled with argon or other inert gas to a pressure of approximately two atmospheres and then sealed off.

In the above process the identical boro-silicate glass which is, of course, transparent is utilized in order to provide an effective edge seal.

In use, the photovoltaic concentrator of FIG. 1 would be installed on a heliostatic array assembly which, for example, might contain 30 to 100 units which would track the sun. Such heliostatic arrays are well known.

Several variations of the concentrator of FIG. 1 are capable of being produced by standard automotive headlamp manufacturing techniques. For example, in FIG. 3 a cassegrain optical configuration is shown where the rays of sunlight 16', 17' are transmitted through in a direct manner as opposed to the reflecting manner of FIG. 1 through the front half 12' of the enclosure, the rear half 11' now being the primary reflector and including aluminized surface 13'. An aluminized cassegrain secondary reflector 21 in combination with primary reflector 13' focuses the rays of sunlight onto photocell 14. The advantage of this configuration is that there need be no water and electrical connections obstructing the impinging light rays. On the other hand, the secondary reflector 21 does somewhat reduce the amount of light received due to secondary obscuring and reflectance loss due to the double reflectance.

FIG. 4 illustrates another possible configuration, optically the same as FIG. 1, where the feedthroughs 22, 23 which retain and locate photocell 14 extend through reflector half 12. This embodiment is believed to have a greater optical transmission capability.

Finally, the embodiment of FIG. 5 illustrates an extreme shape which is possible.

Thus an improved photovoltaic concentrator has been provided.

What is claimed is:

1. A photovoltaic concentrator comprising photocell means for converting received light to electrical energy; reflector means for receiving sunlight and focusing such light onto said photocell; air tight enclosure means in a fixed physical relationship and containing an inert atmosphere, said enclosure means including first and second halves consisting of substantially identical transparent material each having matching extremities and joined together at such extremeties, said first half having an apex at which said photocell means is located within said enclosure and said second half being coated with reflective material to provide said reflector means.

* * * * *